United States Patent
Stahr et al.

(10) Patent No.: US 9,781,845 B2
(45) Date of Patent: Oct. 3, 2017

(54) SEMI-FINISHED PRODUCT FOR THE PRODUCTION OF A PRINTED CIRCUIT BOARD AND METHOD FOR PRODUCING THE SAME

(71) Applicant: AT&S Austria Technologie & Systemtechnik Aktiengesellschaft, Leoben (AT)

(72) Inventors: Johannes Stahr, St. Lorenzen (AT); Mikael Tuominen, Shanghai (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 118 days.

(21) Appl. No.: 14/771,182

(22) PCT Filed: Feb. 27, 2014

(86) PCT No.: PCT/AT2014/050044
§ 371 (c)(1),
(2) Date: Aug. 27, 2015

(87) PCT Pub. No.: WO2014/131071
PCT Pub. Date: Sep. 4, 2014

(65) Prior Publication Data
US 2016/0021763 A1 Jan. 21, 2016

(30) Foreign Application Priority Data
Feb. 27, 2013 (CN) .................... 2013 2 0090479 U

(51) Int. Cl.
*H05K 1/18* (2006.01)
*H05K 3/46* (2006.01)
(Continued)

(52) U.S. Cl.
CPC .......... *H05K 3/4611* (2013.01); *H05K 1/185* (2013.01); *H05K 1/188* (2013.01); *H05K 3/30* (2013.01);
(Continued)

(58) Field of Classification Search
CPC .. H05K 1/185; H05K 1/188; H05K 2201/032; H05K 2203/063;
(Continued)

(56) References Cited

U.S. PATENT DOCUMENTS

2003/0090883 A1* 5/2003 Asahi .................. H01L 21/6835
361/761
2006/0193108 A1 8/2006 Usui et al.
(Continued)

FOREIGN PATENT DOCUMENTS

EP 1225629 A2 7/2002
EP 1304742 A2 4/2003
(Continued)

OTHER PUBLICATIONS

International Preliminary Report on Patentability for International Application No. PCT/AT2014/050044, Report Completed Jun. 23, 2015, dated Jun. 23, 2015, 18 Pgs.
(Continued)

*Primary Examiner* — Yuriy Semenenko
(74) *Attorney, Agent, or Firm* — KPPB LLP

(57) ABSTRACT

In a semi-finished product for the production of a printed circuit board, the semi-finished product comprising a plurality of having multiple insulating layers of a prepreg material and conductive layers (2, 2') of a conductive material and further comprising having at least one electronic component embedded in at least one insulating layer the at least one electronic component is attached to a corresponding conductive layer by the aid of an Anisotropic
(Continued)

Conductive Film and the Anisotropic Conductive Film as well as the prepreg material are in an unprocessed state. The method for producing a printed circuit board comprises the following steps: Providing at least one conductive layer (2), Applying an Anisotropic Conductive Film on the conductive layer, Affixing at least one electronic component on the Anisotropic Conductive Film, Embedding the electronic component in at least one insulating layer of prepreg material to obtain a semi-finished product, Laminating the semi-finished product to process the prepreg material and the Anisotropic Conductive Film.

7 Claims, 3 Drawing Sheets

(51) Int. Cl.
    *H05K 3/32*     (2006.01)
    *H05K 3/30*     (2006.01)

(52) U.S. Cl.
    CPC .............. *H05K 3/323* (2013.01); *H05K 3/46* (2013.01); *H05K 2201/032* (2013.01); *H05K 2203/063* (2013.01); *H05K 2203/068* (2013.01)

(58) Field of Classification Search
    CPC .... H05K 2203/068; H05K 3/30; H05K 3/323; H05K 3/46; H05K 3/4611
    See application file for complete search history.

(56) References Cited

U.S. PATENT DOCUMENTS

| | | | | |
|---|---|---|---|---|
| 2010/0282498 | A1* | 11/2010 | Tezak | H05K 1/186 174/255 |
| 2013/0153269 | A1* | 6/2013 | Takahashi | H05K 3/368 174/254 |
| 2014/0000941 | A1* | 1/2014 | Weidinger | H05K 1/185 174/252 |
| 2014/0254119 | A1* | 9/2014 | Im | C09J 9/02 361/767 |

FOREIGN PATENT DOCUMENTS

| | | |
|---|---|---|
| WO | 2005020651 A1 | 3/2005 |
| WO | 2014131071 A2 | 9/2014 |

OTHER PUBLICATIONS

International Search Report and Written Opinion for International Application No. PCT/AT2014/050044, Search completed May 9, 2014, dated May 20, 2014, 9 Pgs.

\* cited by examiner

SEMI-FINISHED PRODUCT FOR THE PRODUCTION OF A PRINTED CIRCUIT BOARD AND METHOD FOR PRODUCING THE SAME

CROSS-REFERENCE TO RELATED APPLICATIONS

The current application is a U.S. National Stage Patent Application of PCT Patent Application Serial No. PCT/AT2014/050044 entitled "Semi-Finished Product For The Production Of A Printed Circuit Board And Method For Producing The Same" to Stahr et al., filed Feb. 27, 2014, which application claims priority under to Chinese Patent Application Serial No. 201320090479.3, filed Feb. 27, 2013. The disclosures of PCT Patent Application Serial No. PCT/AT2014/050044 and Chinese Patent Application Serial No. 201320090479.3 are hereby incorporated by reference in their entireties.

BACKGROUND OF THE INVENTION

Field of the Invention

The invention relates to a semi-finished product for the production of a printed circuit board, the semi-finished product comprising a plurality of insulating layers of a prepreg material and conductive layers of a conductive material and further comprising at least one electronic component embedded in at least one insulating layer wherein the at least one electronic component is attached to a corresponding conductive layer by the aid of an Anisotropic Conductive Film.

The invention further relates to a method for producing a printed circuit board.

Description of the Related Art

Printed circuit boards, also referred to as printed wire boards are panels carrying and electrically connecting electronic components such as transistors and the like and, hence, form vital parts of electronic products. Printed circuit boards have a more or less complex structure depending on the specific application. In general a printed circuit board has a plurality of alternating conductive layers and insulating layers bonded together by hardening panels of glass fibres impregnated with organic resin, said panels forming the insulating layers. Such panels for use in the production of printed circuit boards are widely known in the industry as "prepregs" (preimpregnated fibres), which are delivered and processed in an uncured, hence viscous state of the organic resin. The actual insulating layer of the printed circuit board results when the organic resin has cured. The insulating layers carry conductive layers, usually formed of copper foil, the conductive layers being appropriately structured to form wirings to electrically connect the electronic components. Modern printed circuit boards allow for a high degree of integration of electronic components and their appropriate wiring.

Starting from traditional printed circuit boards having the electronic components mounted on top of the board, today's electronic components have reached a degree of miniaturisation that allows for their accommodation within inner layers of the printed circuit board. Several methods for connecting an electronic component to its corresponding conductive layer have been proposed, among which soldering, wire bonding and, more recently, contacting by the use of an Anisotropic Conductive Film (ACF) are the most prominent. An Anisotropic Conductive Film is a film made of a polymer in which small beads or spheres of a plastic material are dispersed. The beads or spheres are covered with at least one layer of a conductive material, such as in particular nickel and gold. The Anisotropic Conductive Film is used for contacting an electronic component by applying the Anisotropic Conductive Film onto the corresponding conductive layer and in particular to a connector pad of such a corresponding conductive layer and sticking the electronic component onto the film. In this state the Anisotropic Conductive Film is not electrically conductive since the spheres covered with the conductive material do not contact each other within the film and thus do not provide conductivity from the pads or pins of the electronic component to the underlying conductive layer. It is only upon the application of pressure and heat that the Anisotropic Conductive Film is compressed so that in the areas where the pads or pins of the electronic component compress the film and the coated beads or spheres so that the beads or spheres contact each other, thereby forming conductive bridges from the pads or pins of the electronic component to the underlying corresponding conductive layer. The design of the Anisotropic Conductive Film provides conductivity only in the compressed area of the film, whereas uncompressed areas remain electrically isolating so that only conductivity from the pads or pins of the electronic component to the underlying structure is obtained, and no short circuit between the pads or pins occurs.

When embedding electronic components by using an Anisotropic Conductive Film it is, however, impractical that the processing of the Anisotropic Conductive Film from the initial, unprocessed state in which the Anisotropic Conductive Film is not in its conductive state to the processed state in which electric conduction is provided through the film from the pads or pins of the electronic component to the underlying corresponding conductive layer, usually requires a separate step in which the electronic component is subjected to heat and pressure in order to heat and compress the Anisotropic Conductive Film between the electronic component and the corresponding conductive layer which is, of course, a production step that is undesirable and onerous and thus adds to the production costs of a printed circuit board thus produced. It would therefore be desirable, and it is thus an object of the present invention, to omit this step of subjecting the electronic component and the Anisotropic Conductive Film to heat and pressure while at the same time profiting from the benefits of contacting an electronic component by the aid of an Anisotropic Conductive Film.

To solve this subject the present invention provides for a semi-finished product of the initially mentioned kind which is characterised in that the Anisotropic Conductive Film as well as the prepreg material are in an unprocessed state. The semi-finished product according to the present invention thus is an intermediate in the production of a printed circuit board in which both the Anisotropic Conductive Film for connecting the electronic components as well as the prepreg material are not in a processed state so that the processing of the Anisotropic Conductive Film to provide electric conductivity and processing of the prepreg material to provide mechanical stability to the printed circuit board to be produced can be carried out in one single step. In fact, prepreg material normally is processed, i.e. hardened or cured, by applying heat and pressure during at least one lamination step. The inventors of the present invention found out that the heat and pressure applied in the lamination step can also be used to process the Anisotropic Conductive Film so that the semi-finished product according to the present invention can be used to produce a printed circuit board having embedded components connected and contacted to their corresponding conductive layers by means of an Anisotropic Conductive Film without having to employ a dedicated heating and pressure step just for processing, i.e. compressing, melting and hardening, the Anisotropic Conductive Film. The printed circuit boards produced via the route of the inventive semi-finished product thus stand out for low production costs and at the same time high quality.

Normally, the combined thickness of electronic component and the patch of Anisotropic Conductive Film used to connect the electronic component to the corresponding conductive layer is relatively high as compared to the thickness of a layer of normal prepreg material. The inventive semi-finished product is thus preferably designed such that the at least one insulating layer embedding the electronic component has a clearance for accommodating the at least one electronic component. The clearance accommodating the electronic component helps to keep the component in place during the processing, i.e. the lamination step of the inventive semi-finished product, and helps to relieve the mechanical stress on the component during lamination. However, when an electronic component is very thin, it is also possible to do without providing a clearance for accommodating the electronic component.

As already described above, the inventive semi-finished product allows for processing of the Anisotropic Conductive Film and the prepreg material in one single step. The processing of the Anisotropic Conductive Film requires the Anisotropic Conductive Film to be compressed and thereby reduced in thickness at least in the areas that are pressed by the pads, bumps or pins of the electronic component. This reduction in thickness is achieved when during lamination the layers of prepreg material are compressed and thus set to a reduced thickness. During this setting-phenomenon the thickness of the electronic component naturally remains constant so that the pads, bumps or pins of the electronic component are pressed into the Anisotropic Conductive Film thereby compressing it and hence bringing together the conductive beads or spheres within the Anisotropic Conductive Film. For some implementations of the present invention, it may, however, be necessary to further increase the pressure of the electronic component of the Anisotropic Conductive Film to ensure reliable contacting of the electronic component by the Anisotropic Conductive Film, in particular when the inventive semi-finished product or the printed circuit board resulting from it has an increased number of conductive and insulating layers so that the pressure applied during lamination might not reliably reach down to the embedded component or the embedded components embedded in inner layers of the semi-finished product or printed circuit board resulting from it. According to a preferred embodiment of the present invention it is thus conceivable that the combined thickness of the Anisotropic Conductive Film and the electronic component is greater than the thickness of the at least one insulating layer embedding the electronic component. This means that the electronic component and the Anisotropic Conductive Film used for connecting it are thicker than the surrounding insulating layer or the surrounding insulating layers so that during lamination, pressure is exerted on the Anisotropic Conductive Film by the electronic component already before the phenomenon of setting of the prepreg material occurs. It will be exemplified below that the contacting of the electronic component by means of the Anisotropic Conductive Film can be completed already before the thickness of the layers of prepreg material of the semi-finished product according to the invention is reduced during lamination. It can, however, be proceeded in such a way that the phenomenon of setting and thus of the reduction of the thickness of the layers of prepreg material adds to the reliability of the connection of the electronic component to the corresponding conductive layer.

According to a preferred embodiment of the present invention the Anisotropic Conductive Film (6) comprises a polymer having a flow temperature T1 lower than the flow temperature T2 of the organic resin of the prepreg material. This ensures that, during lamination of the semi-finished product, the polymer of the Anisotropic Conductive Film begins to flow before the resin of the prepreg material flows so that the setting of the Anisotropic Conductive Film and thus contacting of the beads or spheres readily occurs before the prepreg material begins to flow thus safeguarding correct contacting of the component.

The inventive method for producing a printed circuit board according to the present invention is characterized by the following steps:

Providing at least one conductive layer

Applying an Anisotropic Conductive Film on the conductive layer

Affixing at least one electronic component on the Anisotropic Conductive Film

Embedding the electronic component in at least one insulating layer of prepreg material to obtain a semi-finished product Laminating the semi-finished product to process the prepreg material and the Anisotropic Conductive Film.

The method according to the present invention thus is carried out via an intermediate in the production of a printed circuit board in which both the Anisotropic Conductive Film for connecting the electronic components as well as the prepreg material are not in a processed state so that processing of the Anisotropic Conductive Film to provide electric conductivity and processing of the prepreg material to provide mechanical stability to the printed circuit board to be produced can be carried out in one single step. In fact, prepreg material normally is processed, i.e. hardened or cured, by applying heat and pressure during at least one lamination step. The inventors of the present invention found out that the heat and pressure applied in the lamination step can also be used to process the Anisotropic Conductive Film so that the method according to the present invention can be used to produce a printed circuit board having embedded components connected and contacted to their corresponding conductive layers by means of an Anisotropic Conductive Film without having to employ a dedicated heating and pressure step just for processing, i.e. compressing, melting and hardening, the Anisotropic Conductive Film. The printed circuit boards produced by the inventive method thus stand out for low production costs and at the same time high quality. Normally, the combined thickness of electronic component and the patch of Anisotropic Conductive Film used to connect the electronic component to the corresponding conductive layer is relatively high as compared to the thickness of a layer of normal prepreg material. The inventive method is thus preferably carried out in such a way that the at least one insulating layer embedding the electronic component is provided with a clearance for accommodating the at least one electronic component. The clearance accommodating the electronic component helps to keep the component in place during the processing, i.e. the lamination step of the inventive semi-finished product, and helps to relieve the mechanical stress on the component during lamination. However, when an electronic component is very thin, it is also possible to do without providing a clearance for accommodating the electronic component.

As already described above, the inventive semi-finished product allows for processing of the Anisotropic Conductive Film and the prepreg material in one single step. The processing of the Anisotropic Conductive Film requires the Anisotropic Conductive Film to be compressed and thereby be reduced in thickness at least in the areas that are pressed by the pads, bumps or pins of the electronic component. This reduction in thickness is achieved when during lamination the layers of prepreg material are compressed and thus set to a reduced thickness. During this setting-phenomenon the thickness of the electronic component naturally remains constant so that the pads, bumps or pins of the electronic component are pressed into the Anisotropic Conductive Film thereby compressing it and hence bringing together the conductive beads or spheres within the Anisotropic Conductive Film. For some implementation of the present invention, it may, however, be necessary to further increase the pressure of the electronic component of the Anisotropic Conductive Film to ensure reliable contacting of the electronic component by the Anisotropic Conductive Film, in particular when the inventive method is used to produce printed circuit boards having an increased number of conductive and insulating layers so that the pressure applied during lamination might not reliably reach down to the embedded component or the embedded components embedded in inner layers of the semi-finished product or printed circuit board resulting from it. According to a preferred embodiment of the present invention it is thus conceivable that the anisotropic conductive film and the electronic component, prior to the step of lamination, are built up to a combined thickness greater than the thickness of the at least one insulating layer embedding the electronic component. This means that the electronic component and the Anisotropic Conductive Film used for connecting it are thicker than the surrounding insulating layer or the surrounding insulating layers so that during lamination, pressure is exerted on the Anisotropic Conductive Film by the electronic component already before the phenomenon of setting of the prepreg material occurs. It will be exemplified below that the contacting of the electronic component by means of the Anisotropic Conductive Film can be completed already before the thickness of the layers of prepreg material of the semi-finished product according to the invention is reduced during lamination. It can, however, be proceeded in such a way that the phenomenon of setting and thus of the reduction of the thickness of the layers of prepreg material adds to the reliability of the connection of the electronic component to the corresponding conductive layer.

According to a preferred embodiment of the present invention the Anisotropic Conductive Film (6) is chosen to have a flow temperature T1 lower than the flow temperature T2 of the organic resin of the prepreg material. This ensures that, during lamination of the semi-finished product, the polymer of the Anisotropic Conductive Film begins to flow before the resin of the prepreg material flows so that the setting of the Anisotropic Conductive Film and thus contacting of the beads or spheres readily occurs before the prepreg material begins to flow thus safeguarding correct contacting of the component.

BRIEF DESCRIPTION OF THE DRAWINGS

In the following the invention will be described in more detail with reference to the drawings in which

In FIG. 1 the inventive semi-finished product is generally denoted by 1 and comprises a plurality of conductive layers 2, 2' and insulating layers 3, the conductive layers 2, 2' being formed of a conductive material, such as copper foil, whereas the insulating layers 3 usually are formed by a prepreg material, such as FR4. The semi-finished product 1 comprises electronic components 4 embedded in several insulating layers 3. In the context of the present invention "embedded" means that the electronic components 4 are contained within the semi-finished product 1 as opposed to surface mounted components known in the art. The electronic components 4 have pads, bumps or pins 5 that are loosely connected to an Anisotropic Conductive Film 6. The state of the insulating layers 3 made of prepreg material and the state of the Anisotropic Conductive Film 6 is an unprocessed state. In the context of this invention "unprocessed" means that neither the prepreg material of the insulating layers 3 nor the polymer of the Anisotropic Conductive Film are in a hardened or cured state and additionally, in case of the Anisotropic Conductive Film 6, the term "unprocessed" means that the beads or spheres coated with conductive material contained within the Anisotropic Conductive Film do not contact each other and thus do not provide electric conductivity through the Anisotropic Conductive Film 6. The electronic components 4 are accommodated in clearances 7 formed in the insulating layers 3 surrounding the electronic components 4.

Figure 1:
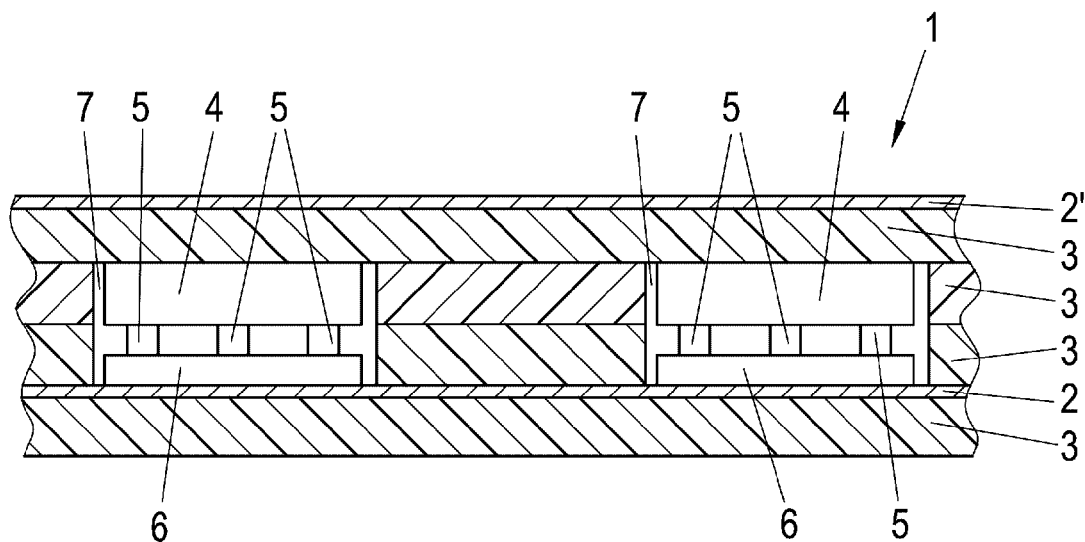
FIG. 1 shows a first embodiment of the inventive semi-finished product prior to lamination.

In the inventive semi-finished product shown in FIG. 1 both the Anisotropic Conductive Film 6 and the prepreg material of the insulating layers 3 are not in their final, operative state and will be processed in one single step of applying heat and pressure, i.e. the lamination process that would have to be employed anyway in order to cure the prepreg material of the insulating layers. By the use of the semi-finished product according to the invention the additional heat and pressure step for processing the Anisotropic Conductive Film 6 can thus be omitted and the merits sought after by the present invention are achieved.

Figure 2:
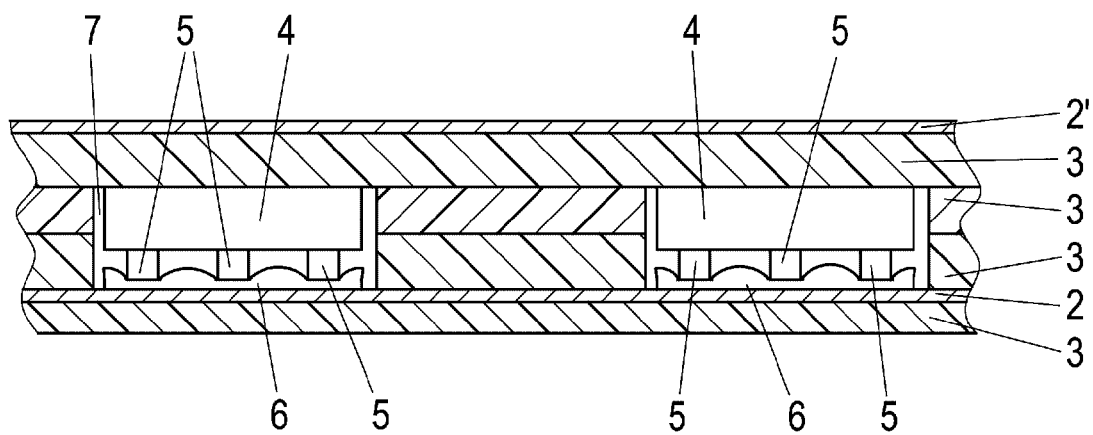
FIG. 2 shows a first embodiment of the inventive semi-finished product after lamination.

FIG. 2 shows the printed circuit board resulting from the lamination of the inventive semi-finished product of FIG. 1 and it can be seen that the insulating layers 3 of prepreg material have been compressed as well as the Anisotropic Conductive Film 6, thereby contacting the pads, bumps or pins 5 of the electronic components to the corresponding conductive layer 2.

Figure 3:
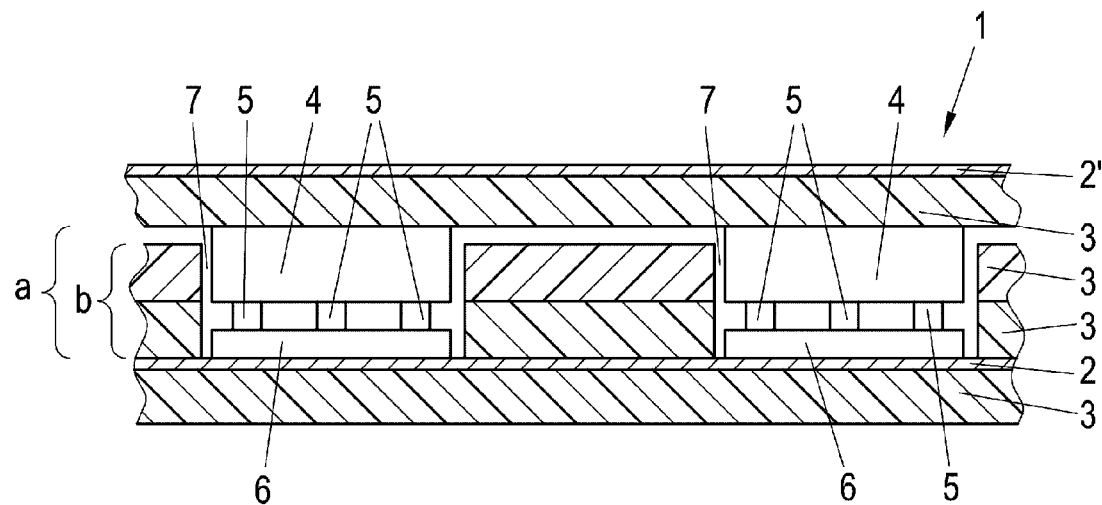
FIG. 3 shows a second embodiment of the inventive semi-finished product prior to lamination.
Figure 4:
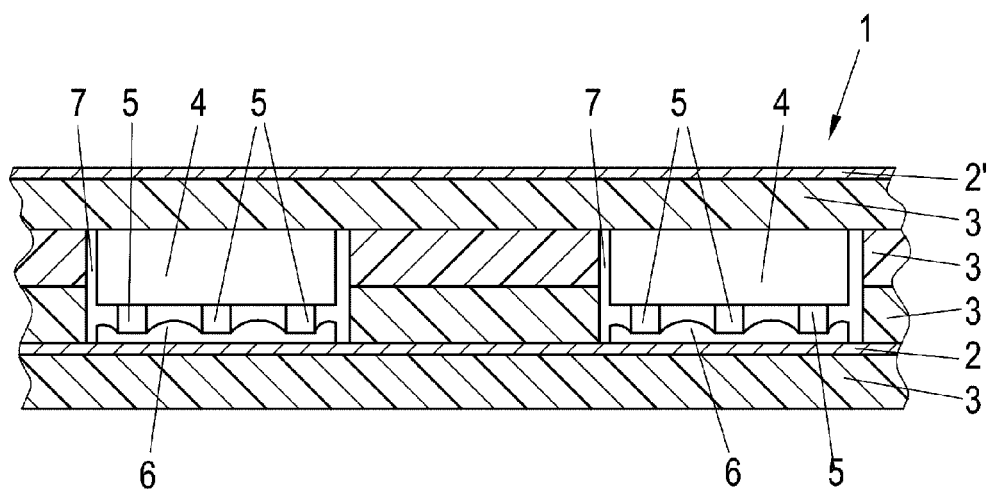
FIG. 4 shows a second embodiment of the inventive semi-finished product after lamination.

FIG. 3 shows an alternative embodiment of the present invention in which the combined thickness a of the Anisotropic Conductive Film 6 and the electronic component 4 is greater than the thickness b of the insulating layers 3 surrounding or embedding the electronic components. Thus when laminating this inventive semi-finished product, depression of the Anisotropic Conductive Film 6 occurs already before the phenomenon of setting of the insulating layers 3 occurs so that setting of the insulating layers 3 is not necessary under all circumstances in order to ensure electric contact between the electronic components 4 and the conductive layer 2. However, lamination of the inventive semi-finished product in order to produce the printed circuit board leads to an even more reliable connection of the electronic components 4 to the corresponding conductive layer 2.

Figure 5A:
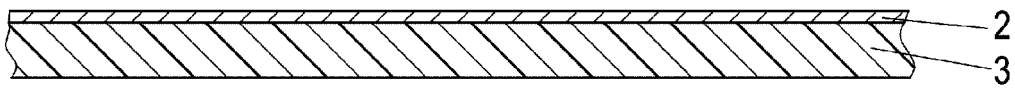
FIGS. 5a to 5e show the inventive method for producing a printed circuit board.
Figure 5B:
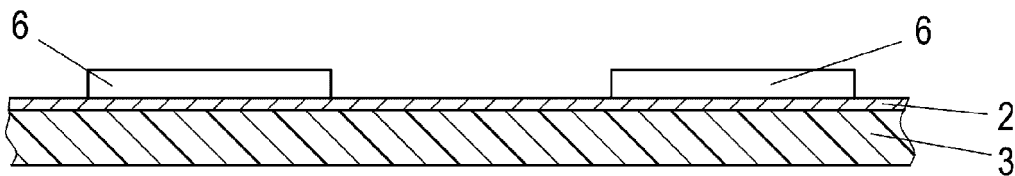
Figure 5C:
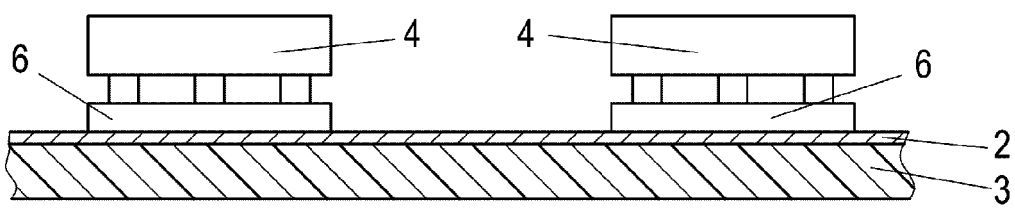
Figure 5D:
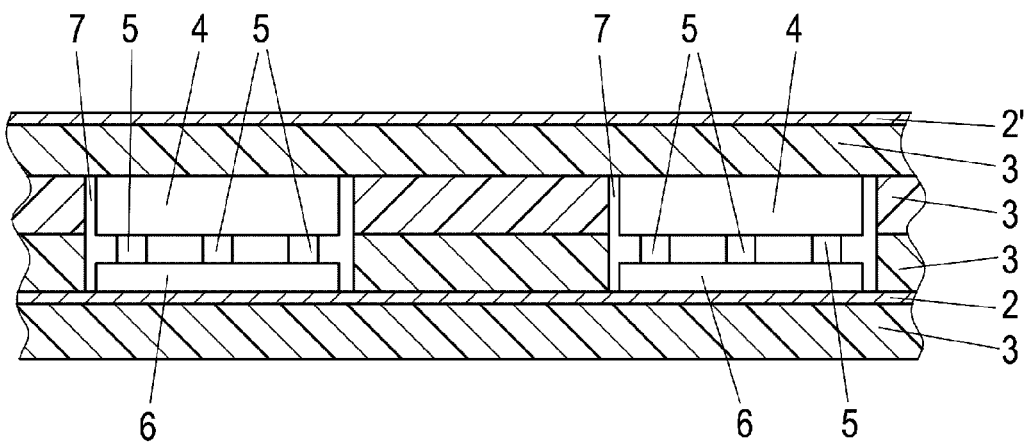
Figure 5E:
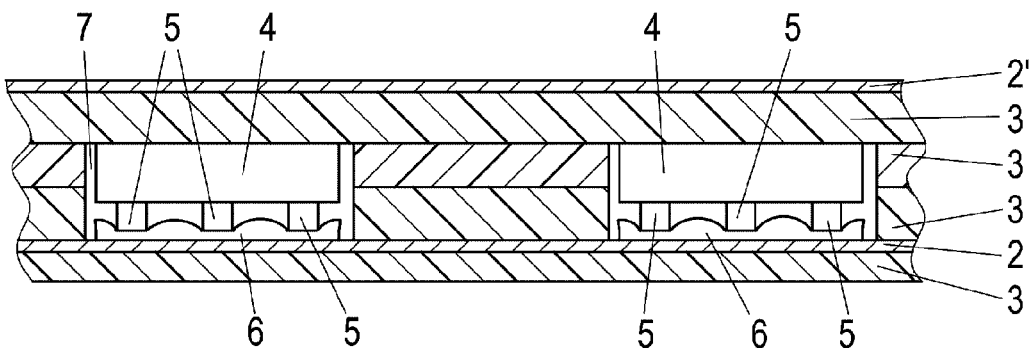

For carrying out the inventive method and for producing the inventive semi-finished product, it will be proceeded as depicted in FIGS. 5a-5e. As shown in FIG. 5a the conductive layer 2 is provided on an insulating layer 3. After this an Anisotropic Conductive Film 6 is applied on the conductive layer 2 in form of two patches thereby providing the possibility of connecting two electric components 4 on the conductive layer 2. The electronic components 4 are then affixed on the Anisotropic Conductive Film 6 thereby profiting from the properties of the Anisotropic Conductive Film 6 to be sticky in the unprocessed state of the Anisotropic Conductive Film. After this the electronic components 4 are embedded in a plurality of insulating layers 3 made of prepreg material, wherein the central conductive layers 2 are cut to provide clearances 7 for the electronic components. The final step of laminating the semi-finished product to process the prepreg material and the Anisotropic Conductive Film 6 leads to a printed circuit board as shown in FIG. 5e.

The invention claimed is:

1. A semi-finished product for the production of a printed circuit board, the semi-finished product comprising:
 a plurality of insulating layers of a prepreg material and conductive layers of a conductive material;
 at least one electronic component collectively surrounded by a first set of the plurality of insulating layers as well as covered by a second set of the plurality of insulating layers;
 wherein the at least one electronic component is attached to a corresponding conductive layer by the aid of an Anisotropic Conductive Film and the Anisotropic Conductive Film as well as the prepreg material are in an unprocessed state; and
 wherein a combined thickness of the Anisotropic Conductive Film and the electronic component between a conductive layer and an insulating layer prior to lamination is greater than a combined thickness of the first set of the plurality of insulating layers surrounding the electronic component after lamination.

2. The semi-finished product according to claim 1, wherein the first set of the plurality of insulating layers surrounding the electronic component has a lateral clearance for accommodating the at least one electronic component.

3. The semi-finished product according to claim 1, wherein the Anisotropic Conductive Film comprises a polymer having a flow temperature lower than the flow temperature of the organic resin of the prepreg material.

4. The semi-finished product according to claim 1, wherein a combined thickness of the Anisotropic Conductive Film and the electronic component prior to lamination is greater than a thickness of the plurality of insulating layers surrounding the electronic component prior to lamination.

5. A method for producing a printed circuit board comprising:
 providing at least one conductive layer;
 applying an Anisotropic Conductive Film on the conductive layer;
 affixing at least one electronic component on the Anisotropic Conductive Film
 surrounding the electronic component in a first plurality of insulating layers of prepreg material to obtain a semi-finished product; and
 laminating the semi-finished product between a second plurality of insulating layers to process the prepreg material and the Anisotropic Conductive Film and to embed the at least one electronic component in the plurality of insulating layers;
 wherein the Anisotropic Conductive Film and the electronic component, prior to the step of lamination, are built up to a combined thickness greater than a combined thickness of the first plurality of insulating layers surrounding the electronic component, whereby during the lamination a pressure is exerted on the Anisotropic Conductive Film by the electronic component before setting of the prepreg material occurs.

6. The method according to claim 5, wherein the first plurality of insulating layers surrounding the electronic component is provided with a lateral clearance for accommodating the electronic component.

7. The method according to claim 5, wherein the Anisotropic Conductive Film is chosen to have a flow temperature lower than the flow temperature of the organic resin of the prepreg material.

\* \* \* \* \*